United States Patent
Weiss et al.

(10) Patent No.: US 9,496,496 B2
(45) Date of Patent: Nov. 15, 2016

(54) METHOD FOR PRODUCING AN ELECTRODE LAYER OF AN ELECTRICAL DEVICE

(71) Applicant: Technische Universität Dresden, Dresden (DE)

(72) Inventors: Nelli Weiss, Dresden (DE); Lars Mueller-Meskamp, Dresden (DE); Jan Ludwig Bormann, Dresden (DE); Franz Selzer, Dresden (DE); David Kneppe, Dresden (DE); Nikolai Gaponik, Dresden (DE); Alexander Eychmueller, Dresden (DE)

(73) Assignee: TECHNISCHE UNIVERSITÄT DRESDEN, Dresden (DE)

( * ) Notice: Subject to any disclaimer, the term of this patent is extended or adjusted under 35 U.S.C. 154(b) by 0 days.

(21) Appl. No.: 14/868,540

(22) Filed: Sep. 29, 2015

(65) Prior Publication Data
US 2016/0093805 A1    Mar. 31, 2016

(30) Foreign Application Priority Data
Sep. 30, 2014    (DE) .................. 10 2014 114 168

(51) Int. Cl.
G01R 31/26    (2014.01)
H01L 21/66    (2006.01)
H01L 21/00    (2006.01)
H01L 51/00    (2006.01)

(52) U.S. Cl.
CPC ................................ H01L 51/0002 (2013.01)

(58) Field of Classification Search
CPC .................................................. H01L 51/0002
USPC ........................................................ 438/22
See application file for complete search history.

(56) References Cited

U.S. PATENT DOCUMENTS

2005/0126338 A1* 6/2005 Yadav .................... B82Y 30/00
                                                              75/255
2010/0243295 A1* 9/2010 Allemand .............. B82Y 10/00
                                                             174/250
2014/0170383 A1   6/2014 Miszta et al.

FOREIGN PATENT DOCUMENTS

DE    102012102319 A1    9/2013
EP         1947702 A2    7/2008

OTHER PUBLICATIONS

Choi et al., "Annealing-Free, Flexible Silver Nanowire-Polymer Composite Electrodes via a Continuous Two-Step Spray-Coating Method," Nanoscale, 2012, 1-8.
Garnett et al., "Self-Limited Plasmonic Welding of Silver Nanowire Junctions," Nature Materials, 2012, 11:241-249.
Gaynor et al., "Colors in the Corners: ITO-Free White OLEDs with Angular Color Stability," Advanced Materials, 2013, 25(29):4006-4013.
Hu et al., "Scalable Coating and Properties of Transparent, Flexible, Silver Nanowire Electrodes," ACS Nano, 2010, 4 (5):2955-2963.
Jiu et al., "High-Intensity Pulse Light Sintering of Silver Nanowire Transparent Films on Polymer Substrates: The Effect of the Thermal Properties of Substrates on the Performance of Silver Films," Nanoscale, 2013, 23 (5):11820-11828.
MacDonald, "Engineered Films for Display Technologies," J. Mater. Chem., 2004, 14:4-10.
Sachse et al., "Transparent, Dip-Coated Silver Nanowire Electrodes for Small Molecule Organic Solar Cells," Organic Electronics, 2013, 14(1):143-148.
Sepulveda-Mora et al., "Figures of Merit for High-Performance Transparent Electrodes Using Dip-Coated Silver Nanowire Networks," Journal of nanomaterials, 2012, pp. 1-7.
Song et al., "Nanoscale Joule Heating and Electromigration Enhanced Ripening of Silver Nanowire Contacts," ACS Nano, pp. A-H.
Song et al., "Highly Efficient and Bendable Organic Solar Cells with Solution Processed Silver nanowire Electrodes," Adv. Funct. Mater., 2013, 23:4177-4184.
Tokuno et al., "Fabrication of Silver Nanowire Transparent Electrodes at Room Temperature," Nano Research, 2011, 4(12):1215-1222.
Zardetto et al., "Substrates for Flexible Electronics: A Practical Investigation of the Electrical, Film Flexibility, Optical, Temperature, and Solvent Resistance Properties," Journal of Polymer Sciences Part B:Polymer Physics, 2011, 49:638-648.
Zhu et al., "Biodegradable Transparent Substrates for Flexible Organic-Light-Emitting Diodes," Energy Environ. Sci., 2013, 6:2105-2111.

* cited by examiner

*Primary Examiner* — Calvin Choi
(74) *Attorney, Agent, or Firm* — Sutherland Asbill & Brennan LLP

(57) ABSTRACT

The invention relates to a method for producing an electrode layer of an electrical device, wherein the method includes the following steps: providing a quantity of nanoparticles from an electrically conductive material, the surfaces of each of which have a layer of a hygroscopic stabilizer material, preparing a substrate and producing an electrode layer on a substrate surface, wherein the nanoparticles in this context are deposited on the substrate surface and are tempered in a solvent atmosphere of a polar solvent.

11 Claims, 3 Drawing Sheets

METHOD FOR PRODUCING AN ELECTRODE LAYER OF AN ELECTRICAL DEVICE

CROSS REFERENCES TO RELATED APPLICATIONS

Figure 1:
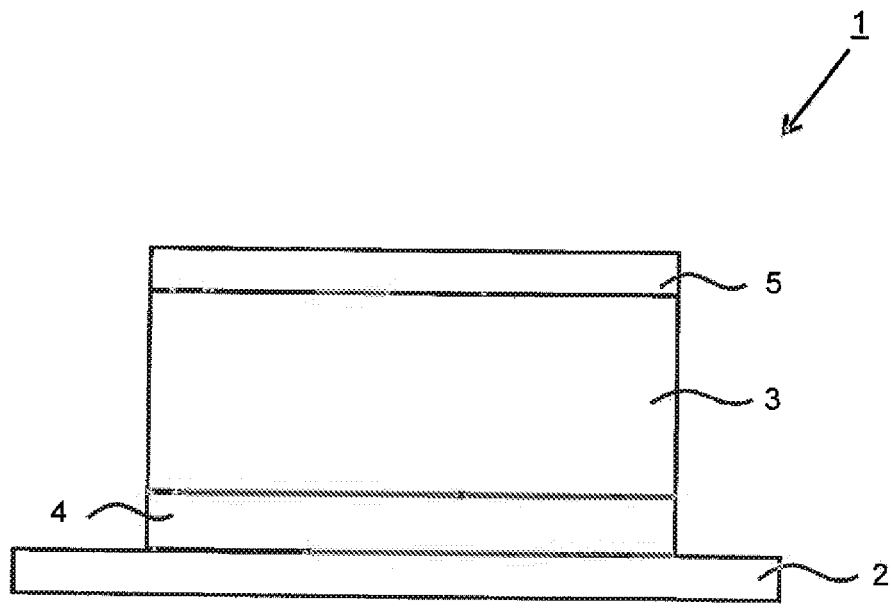

This application claims priority to German Application No. 10 2014 114 168.7, filed Sep. 30, 2014, the entire contents of which are incorporated by reference herein.

FIELD OF THE INVENTION

The invention relates to a method for producing an electrode layer of an electrical device.

TECHNICAL BACKGROUND

Various types of electrical devices have been equipped with flat electrodes. Such devices include for example organic devices, either in the form of an organic light emitting diode or a solar cell, in which a stack of layer consisting of organic materials is arranged between device electrodes placed opposite each another. In these or other devices, the electrodes are produced by depositing an electrode material on a substrate surface. In this context, the substrate on which the flat electrode is deposited may be a device substrate on which the device is produced, as a layer stack, for example. But device layers that have been applied previously, organic layers, for example, or inorganic barrier layers, may be used as the substrate base on which the flat electrode is deposited subsequently.

A method for producing a flat electrode in the form of silver nanowires has been suggested in which a substrate is coated with a network of metal nanowires in the form of metal particles. In order to deposit the silver nanowires (AgNW), they are sprayed, printed or dipped. The silver nanowires that are currently offered on the market are produced in a wet chemical process. In order to ensure the shape of the wire, and later the solubility of the AgNWs in solvents such as water and alcohols, it was suggested that a stabiliser be added during the synthesis. Poly(vinyl)pyrrolidone (PVP) is often used in conjunction with AgNWs. The polymer stabiliser bonds to the surface of the wire during synthesis and remains in the form of a thin layer from 1 to 3 nm thick even after the wires have been cleaned. Since PVP is an electrical insulator, the contact resistance between the nanowires is accordingly very high, and the newly produced electrodes therefore have a high sheet resistance.

In order to lower sheet resistance, processes such as mechanical pressing, thermal, nanoplasmonic or ohmic annealing are used. In addition, AgNWs are combined in a conductive layer with other substances such as polymers, graphene or graphene oxide, carbon nanotubes, metal or oxide nanoparticles. One method that is often used is thermal annealing of the AgNW electrode. Depending on the dimension (diameter) of the AgNWs, temperatures from 120 to 250° C. were applied for periods from 15 to 120 minutes (Sachse et al., Organic Electronics, 14(1), 143-148, 2013; Sepulveda-Mora et al., Journal of Nanomaterials, 2012, 1-7; M. Song et al., 4177-41 84.). In this process, PVP melts and is partly destroyed, which leads to deformation of the wires ("spaghetti effect"), an enlarged contact area between the wires, and sometimes causes melting at the junctions points. This in turn results in a lower electrode sheet resistance. The thermal treatment of AgNW electrodes is costly in terms of both time and energy. It is difficult or even impossible to use on flexible polymer substrates, because many polymer films are destroyed or lose their flexibility and translucency (transmission) at the necessary or optimal processing temperatures. Lowering the temperature prolongs processing times, which is technologically disadvantageous.

Other methods known from the literature rely on the effects of heat: HIPL (High-Intensity Pulse Light) (Jiu et al., Nanoscale, 5, 11820-11828, 2013), surface plasmonic (Garnett et al., Nature Materials, 11(3), 241-92012, 2014) and ohmic nanowelding (Song et al., ACS Nano, 8(3), 2804-281 1, 2014) of AgNWs. The network is heated locally or over the entire surface by light or electricity, and these literature sources claim a particular, advantageous warming of the contact points for individual methods. HIPL, surface plasmonic and ohmic nanowelding take effect in a very short period of time, but they require the use of additional, complex equipment and devices.

The alternative method, using mechanical pressing to lower contact resistance, was demonstrated for glass and polymer substrates (Gaynor et al., Advanced Materials (Deerfeld Beach, Ha.), 25(29), 4006-1 3, 2013; Hu et. al, ACS Nano, 4(5), 2955-63, 2010; Tokuno et al., Nano Research, 4(12), 1215, 2011). In this context, processing usually took place at an elevated temperature (>80° C.) and a pressure of 25 MPa to 81 GPa. Mechanical pressing is expensive and better suited for polymer substrates because there is a risk that glass will break. Furthermore, the wires can become deformed, which impairs the electrode's ability to transmit (Gaynor et al., Advanced Materials (Deerfeld Beach, Fla.), 25(29), 4006-1 3, 2013; Hu et al., ACS Nano, 4(5), 2955-63, 2010).

Another way to lower the contact resistance is to create hybrid layers. In this way, highly conductive electrodes were created by applying PEDOT:PSS to AgNWs (Dong Yun Choi et al, Nanoscale, 5(3), 977-983, 2013). In this case too, an enlargement of the contact area between overlapping nanowires was observed. Electrodes that were produced at room temperature manifested similar properties to heated electrodes: 10.76 Ohm/sq with 84.3% transmission. One disadvantage of a PEDOT:PSS layer is its undesirable parasitic absorption. PEDOT:PSS is also acidic and can cause undesirable corrosion of nanowires.

SUMMARY OF THE INVENTION

The object of the invention is to describe a method for producing an electrode layer of an electrical device with which it is possible to produce the electrode with less effort.

In order to solve this object, a method for producing an electrode layer of an electrical device has been devised, the method comprising the following steps: providing a quantity of nanoparticles from an electrically conductive material, the surfaces of each of which have a layer of a hygroscopic stabiliser material; preparing a substrate; and producing an electrode layer on a substrate surface, wherein the nanoparticles are deposited on the substrate surface and are tempered in a solvent atmosphere of a polar solvent.

According to one aspect, a method for producing an electrode layer of an electrical device or component is provided, in which a quantity of nanoparticles is prepared from an electrically conductive material. Each surface of the nanoparticle is covered with a layer of a hygroscopic stabiliser material, wherein said layer may be closed or not closed. A substrate is prepared as part of the method. The substrate may be a device substrate on which the electrical device is produced. But a material layer of the device, for example, which has itself been prepared in advance, for example by deposition of a layer material, may also serve as the substrate for producing the electrode layer. In this process, an electrode layer is produced on a substrate surface by depositing the nanoparticles on the substrate surface and tempering it in a solvent atmosphere. A polar solvent is used to create the solvent atmosphere.

When the nanoparticles are deposited, they may form a network of nanoparticles on the substrate surface, in which some of the deposited nanoparticles overlap each other.

The device electrode that is produced with the electrode layer may be produced from the electrode layer of deposited nanoparticles or beside the layer of the deposited nanoparticles with one or more additional layers.

Tempering in the solvent atmosphere may be carried out in a low temperature atmosphere. Tempering at temperatures not exceeding 120° C., or at temperatures not exceeding 85° C. may be envisaged.

The solvent atmosphere may be applied only after the deposition, particularly only during tempering, or alternatively at least intermittently during deposition. If the nanoparticles are deposited without the use of a solvent atmosphere, this may take place as part of a dry deposition.

Surprisingly, it was found that device electrodes having a low ohmic resistance may be produced by means of the suggested method. When producing the electrode layer, it is also possible to dispense with the use of additional materials such as polymers or other nanoparticles, which can have a disadvantageous influence on the electrodes produced. In this way, additional expense may be avoided.

Metal nanoparticles may be used as the nanoparticles. For example, silver nanoparticles may be used. Metal nanoparticles consisting of several different metals may be used. Metal nanoparticles of the following compounds may be used: copper, gold, nickel, alloys thereof and particles with a core-shell structure such as Ag/Ni, Ag/Au, Ag/Cu, Cu/Ni, Cu/Ag, Cu/Au, Ni/Au, Ni/Ag; and/or Ni/Cu. The surfaces of the metal nanoparticles may also be covered partly or entirely by a metal or semimetal oxide layer, including but not exclusively $CuO_x$, $NiO_x$, $ZrO_2$, $In_2O_3$, $SnO_2$, $Al_2O_3$, $TiO_2$, $Ta_2O_5$ or $SiO_2$. The surfaces of the metal nanoparticles may have a partial or fully covering shell of organic material, and the shell may have a stabilising effect on the nanoparticles. The shell may be an organic, hygroscopic shell.

Nanowire particles may be used as the nanoparticles. Silver nanowire particles lend themselves to such use. The nanowire particles may have a diameter between about 20 nm and about 200 nm and an aspect ratio (length/diameter) of at least about 100. The nanowire particles may be about 5 µm to about 500 µm long. The nanowire particles may have a diameter from about 20 nm to about 200 nm. Alternatively, a diameter from about 30 nm to about 90 nm may be envisaged.

One embodiment provides that the layer consists of a hygroscopic stabiliser substance made from a polymer material. For example, poly(vinyl)pyrrolidone or copolymers thereof with acrylate monomers, N-vinylimidazole, dimethyl aminomethacrylate, vinyl acetate and N-vinyl caprolactam, also polyacrylic acid and polyamides may be used.

The nanoparticles may be deposited in a vapour atmosphere. Alternatively, it may be provided that the vapour atmosphere is applied after the deposition.

Tempering in the solvent atmosphere may be carried out during the deposition and/or after the nanoparticles have been deposited on the substrate surface.

According to a further development, it may be provided that the substrate is thermally unstable above a limit temperature, and tempering in the solvent atmosphere is carried out in a temperature range that does not exceed the limit temperature. Tempering can be carried out at temperatures below 85° C. Above the limit temperature, the thermal instability of the substrate causes one or more properties of the substrate to change, which are detrimental at least for the use of the substrate in the electrical device. For example, deformations such as shrinkage or expansion may occur, or it is possible for the substrate to harden or even break (see for example MacDonald, J. Mater. Chem. 2004, 14, 4; Zhu et al. Energy Environ. Sci., 2013, 6, 2105; Zardetto et al., J. Polym. Sci. B 2011, 49, 638-648).

A polymer substrate may be used as the substrate. The polymer substrate may be a device substrate on which the functional layers of the electrical device are deposited. Polyethylene terephthalate (PET), polyethylene naphthalate (PEN), polycarbonates (PC) or polyether sulfone (PES) may be used as the transparent, flexible plastic substrate. Additional layers may have been deposited on the polymer substrate, for the purposes of smoothing the surface (varnishing), modifying the surface energy (oxide layers) and/or as a vapour barrier to protect the device, for example.

The electrode layer may be produced in a device electrode of an organic device, in which a stack of layers made from organic materials is arranged between devices electrodes arranged opposite each other. The organic device may be an organic light emitting diode or an organic solar cell.

The electrode layer may be produced as a layer of a device or component that emits light or absorbs light and is light-transparent in at least one wavelength working range. The wavelength working range may for example correspond to the visible light range, or to one or more other subranges thereof. In the case of a light emitting device, for example an organic light emitting diode, the light transparency of the electrode layer supports the emission of the light generated in the device. In the case of a light absorbing device, a solar cell for example, the light-transparent design enables the light that is to be absorbed to enter the device via the device electrode. The light-transparency of the electrode layer may then also be created for the device electrode in the same or a different form, which optionally has additional layers.

The electrode layer may be produced on a functional layer that has been deposited on the substrate surface previously. The deposited functional layer may be any device layer that is intended to come into contact with the electrode in the electrical device. For example, the functional layer may be a layer consisting of an organic material. A stack of functional layers may also have been deposited beforehand.

DESCRIPTION OF EMBODIMENTS

Figure 2:
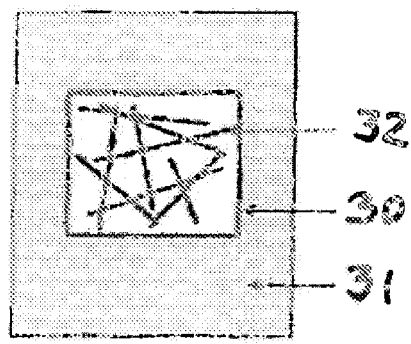
Figure 3:
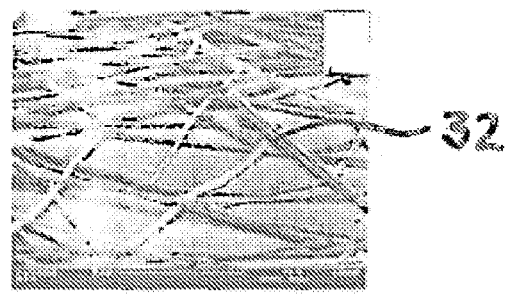
Figure 4:
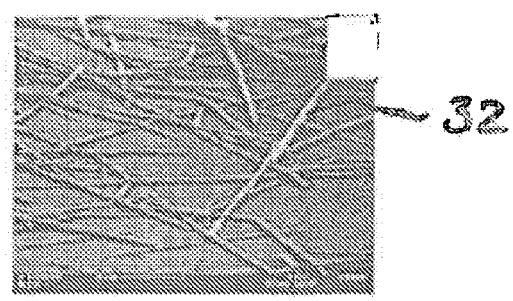
Figure 5:
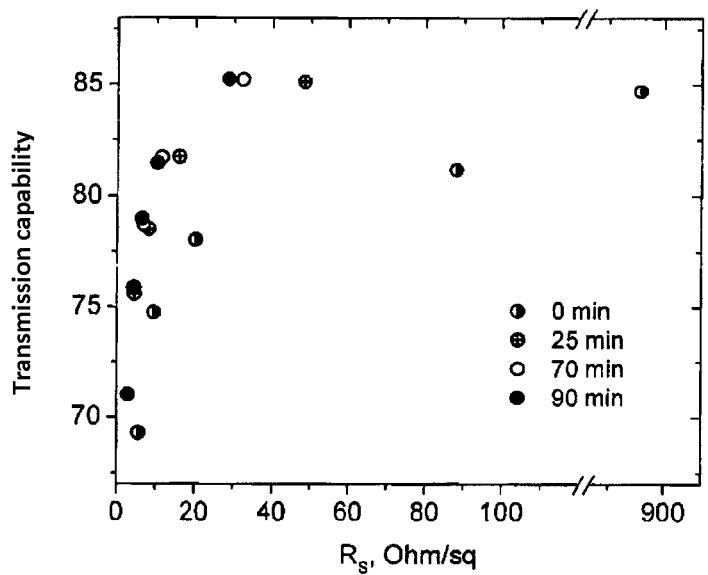
Figure 6:
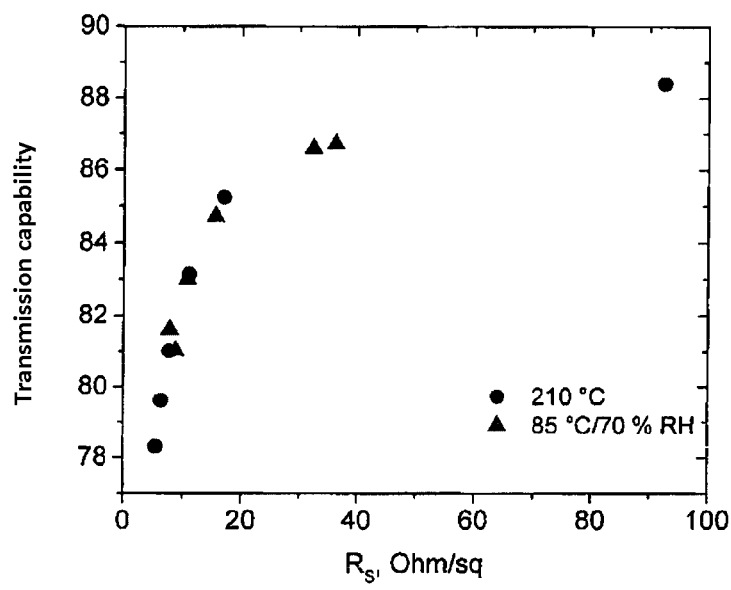

In the following, further embodiments will be explained in greater detail with reference to the figures of a drawing. In the drawing:

FIG. 1 is a schematic representation of an electrical device,

FIG. 2 is a schematic representation of a network of nanowire particles (nanowire network) on a substrate, FIG. 3 is an image taken with a scanning electron microscope during examination of a section of a layer for a device electrode made from silver nanowire particles after the nanowire particles have been deposited, FIG. 4 is an image taken with a scanning electron microscope during examination of a section of a layer for a device electrode made from silver nanowire particles after tempering in a vapour atmosphere, FIG. 5 is a graphical representation of measurements of the optical transmission capability as a function of sheet resistance (Rs), and FIG. 6 is a graphical representation of measurements of the optical transmission capability as a function of sheet resistance (Rs).

FIG. 1 shows a schematic representation of an electrical device 1, in which a stack of device layers 3 is arranged on a device substrate 2. Device layers 3 may be produced with the aid of various methods, including for example deposition by vaporisation of one or more layer materials in a vacuum. Other possible methods for producing the layers are sputtering and printing. Device layers 3 of electrical device 1 may be produced by the same or different methods. For example, electrical device 1 may be an organic device in which the stack of device layers 3 is constructed with layers made from organic materials. But layers of non-organic materials may also be provided.

In the stack of device or component layers 3, an electrode 4 is deposed on device substrate 2. A counter electrode 5 forms a top electrode. Electrode 4 and counter electrode 5 are each designed as flat device electrodes. They may be made from the same or different electrically conductive materials. Electrode 4 and counter electrode 5 may each be of monolayer or multilayer construction. One or more devices layers may be arranged in the intermediate area 6 between electrode 4 and counter electrode 5.

In order to produce electrode 4 and/or counter electrode 5, a method may be used in which electrically conductive nanoparticles, particularly nanowire particles, are deposited on a substrate layer positioned below them. The surfaces of the nanoparticles are coated with a layer consisting of a microscopic stabiliser material. This may be a layer of poly(vinyl)pyrrolidone (PVP), for example. Silver nanowire particles for example may be used as nanowire particles.

A tempering step is carried out in a solvent atmosphere of a polar solvent, for example in a vapour atmosphere that is created by water vapour or vapour from another polar solvent, during and/or after the nanoparticle deposition process. Surprisingly, it has been found that the electrical properties of the device electrode contained in the network of deposited nanoparticles are better than those of electrodes that have undergone thermal treatment without a solvent atmosphere. In particular, the contact resistance between the nanoparticles is reduced.

FIG. 2 shows a schematic representation of the arrangement of nanowire particles 20 on a substrate surface 21 produced by the method. The nanowire particles 20 form a nanowire network 22.

FIGS. 3 and 4 show images taken with a scanning electron microscope of a layer 30 for a device electrode (electrode layer) on a substrate 31, wherein layer 30 was produced using silver nanowire particles 32 according to the method described in the preceding text. The images shown were recorded with a Carl Zeiss DSM 982 scanning electron microscope at an angle of 85° and with 7 kV acceleration voltage and magnifications of 20,000× (FIG. 3) and 10,000× (FIG. 4). The measurement bar corresponds to 2 μm. Tempering was carried out in a vapour atmosphere. Whereas FIG. 3 shows the arrangement of silver nanowire particles 32 before tempering, FIG. 4 shows the arrangement of silver nanowire particles 32 after tempering, at 85° C. and with 85% relative humidity.

Because of its hygroscopic property, the stabiliser material (PVP) adsorbs water molecules from the environment. The absorption of water can cause the properties of the polymer to change, in terms of stability and reactivity. Thus for example, if the water content is high, the characteristic glass transition temperature may be lowered significantly. This means that PVP melts at significantly lower temperatures and is transformed into a flexible, rubbery state. The polymer becomes "sticky", which can make movement of material at the boundary surface easier and increase adhesion to the substrate and therewith also the capillary forces between the wires. As a consequence, the contact resistance of the wires and thus also the sheet resistance may be diminished. It is further assumed that the free volume of the polymer is also increased by the adsorption of water as the attractive forces between the polymer chains are weakened. The polymer molecules become more mobile and the wires have more opportunities to react with each other on the basis hydrophobic interactions. As a result, the nanowires are attracted to each other particularly at the junction points, and this is reflected positively in the sheet or layer resistance values.

FIG. 5 is a graphical representation of measurements of the transmission capability at a wavelength of 550 nm as a function of the sheet resistance (Rs) for an untempered sample (0 min) and a sample (electrode) that has been tempered at 85° C. in 85% atmospheric humidity after 25, 70 and 90 minutes. A significant reduction in the sheet resistance is clearly evident.

FIG. 6 is a graphical representation of measurements of the transmission capability at a wave-length of 550 nm as a function of the sheet resistance (Rs) for a sample that was tempered on the heating plate at 210° C. for 90 min (circles) and a sample that was tempered in the climate cabinet at 85° C. in 70% atmospheric humidity for 120 minutes (triangles). Comparable sheet resistance values were also achieved in a vapour atmosphere at significantly lower temperatures.

In order to prepare the samples analysed, for which the experimental analyses are shown in FIGS. 5 and 6, silver nanowires SLV-NW-90 (BlueNano, USA) were deposited on a 2.5×2.5 $cm^2$ BK7 glass substrate (Schott, Mainz, Germany) by spray-coating. Then, the electrodes were tempered for 120 min in a climate cabinet at temperatures between 45° C. and 90° C. and in relative humidity between 15 and 90%. At the same time, a reference electrode was tempered in air on a hot plate for 90 min at 210° C. Finally, the transmission at 550 nm was measured with a spectrometer (Shimadzu), and the sheet resistance was measured with a four point probe setup (Lucas Labs).

Further samples were prepared by depositing SLV-NW-90 silver nanowires on a plastic foil material by-spray-coating. Then the electrodes produced in this way were tempered in the climate cabinet for 120 minutes at a temperature of 85° C. and in relative humidity of 70%. At the same time, a reference electrode was tempered in air on a hot plate for 30 min at 140° C.

When a PET foil (Melinex ST504, DuPont Teijin Films) was used, this led to a reduction of the initial sheet resistance from 4500 Ohm/sq to 30.5 Ohm/sq. The transmission capability for a wavelength of 550 nm was 82.8%. In order to achieve a similar reduction in the sheet resistance of a reference electrode that had been tempered in air, the application required a considerably higher temperature, 140° C.

When a PEN foil (Teonex Q65F, DuPont Teijin Films) was used, the sheet resistance was reduced from 406 Ohm/sq to 17.8 Ohm/sq. The transmission capability for a wavelength of 550 nm found to be 81.8%. The same measuring conditions as described above were used.

The features disclosed in the preceding description, the claims and the drawing may be significant both individually and in any combination for realising the various configurations.

The invention claimed is:

1. A method for producing an electrode layer of an electrical device, comprising the following steps:
   providing a quantity of nanoparticles of an electrically conductive material, the surfaces of the nanoparticles having a layer of a hygroscopic stabiliser material;
   providing a substrate; and
   producing an electrode layer on a surface of the substrate, wherein the nanoparticles are deposited on the surface of the substrate and are tempered in a solvent atmosphere of a polar solvent.

2. The method according to claim 1, wherein the nanoparticles are metal nanoparticles.

3. The method according to claim 1, wherein the nanoparticles are nanowire particles.

4. The method according to claim 1, wherein the layer consists of a hygroscopic stabiliser material made from a polymer material.

5. The method according to claim 1, wherein the nanoparticles are deposited in a water vapour atmosphere.

6. The method according to claim 1, wherein the tempering in the solvent atmosphere is carried out during deposition and/or after the deposition of the nanoparticles on the surface of the substrate.

7. The method according to claim 1, wherein the substrate is thermally unstable above a limit temperature and tempering in the solvent atmosphere is carried out in a temperature range that does not exceed the limit temperature.

8. The method according to claim 1, wherein the substrate is a polymer substrate.

9. The method according to claim 1, wherein the electrode layer is produced from the nanoparticles as an electrode layer of an organic device, in which a stack of layers made from organic materials is arranged between device electrodes that are positioned opposite each other.

10. The method according to claim 1, wherein the electrode layer is produced as a layer of a device that emits light or absorbs light and is light-transparent in at least one wavelength working range.

11. The method according to claim 1, wherein the electrode layer is produced on a functional layer that has been deposited on the surface of the substrate beforehand.

* * * * *